US007876171B2

(12) United States Patent
Mori et al.

(10) Patent No.: US 7,876,171 B2
(45) Date of Patent: Jan. 25, 2011

(54) BALANCE-UNBALANCE CONVERSION ELEMENT

(75) Inventors: Hirotsugu Mori, Yasu (JP); Motoharu Hiroshima, Nomi (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 12/640,374

(22) Filed: Dec. 17, 2009

(65) Prior Publication Data

US 2010/0090776 A1 Apr. 15, 2010

Related U.S. Application Data

(63) Continuation of application No. PCT/JP2008/059430, filed on May 22, 2008.

(30) Foreign Application Priority Data

Jul. 13, 2007 (JP) ............................ 2007-183824

(51) Int. Cl.
*H03H 7/42* (2006.01)
*H01P 3/08* (2006.01)

(52) U.S. Cl. ........................................ 333/26; 333/204

(58) Field of Classification Search ................... 333/25, 333/26, 204

See application file for complete search history.

(56) References Cited

U.S. PATENT DOCUMENTS 6,150,897 A 11/2000 Nishikawa et al.
7,567,143 B2 7/2009 Mori et al.
2008/0224796 A1 * 9/2008 Mori et al. .................... 333/25

FOREIGN PATENT DOCUMENTS

JP 10-290107 10/1998
WO WO 2008/041398 4/2008

OTHER PUBLICATIONS

PCT/JP2008/059430 Written Opinion dated Jun. 5, 2008.

* cited by examiner

*Primary Examiner*—Dean O Takaoka
(74) *Attorney, Agent, or Firm*—Dickstein Shapiro LLP

(57) ABSTRACT

A balance-unbalance conversion element that easily adjusts the phase balance between two balance signals. The balance-unbalance conversion element includes a dielectric substrate and an electrode pattern on a surface of the dielectric substrate. The electrode pattern includes a first ¼-wavelength resonance line coupled to a first balance terminal; a second ¼-wavelength resonance line coupled to a second balance terminal; a ½-wavelength resonance line having a first open end coupled to an unbalance terminal and the first ¼-wavelength resonator and a second open end coupled to the second ¼-wavelength resonator; and a balance characteristic adjustment electrode having a tip end opposed to a side of the ½-wavelength resonance line and a base end electrically coupled to a ground electrode. A center line of the electrode pattern on the surface of the dielectric substrate and the center of the tip end of the balance characteristic adjustment electrode are separated from each other.

11 Claims, 3 Drawing Sheets

BALANCE-UNBALANCE CONVERSION ELEMENT

CROSS REFERENCE TO RELATED APPLICATIONS

The present application is a continuation of International Application No. PCT/JP2008/059430, filed May 22, 2008, and claims priority to Japanese Patent Application No. JP2007-183824, filed Jul. 13, 2007, the entire contents of each of these applications being incorporated herein by reference in their entirety.

FIELD OF THE INVENTION

The present invention relates to a balance-unbalance conversion element having a balance terminal and an unbalance terminal.

BACKGROUND OF THE INVENTION

There have been devised balance-unbalance conversion elements that have one ½-wavelength resonator and two ¼-wavelength resonators formed on a dielectric substrate and performs balance-unbalance conversion (for example, see Patent Document 1).

FIG. 1 shows a related-art example where a balun is formed as a balance-unbalance conversion element. A balun 101 is formed by laminating multiple dielectric substrates. The balun 101 includes ground electrodes (not shown) provided on a top surface A and a bottom surface B, an unbalance terminal (not shown) provided on a left side surface C, and two balance terminals (not shown) provided on a right side surface D. An unbalance pattern 102 is provided on an illustrated top surface of a substrate 105. The unbalance pattern 102 is an electrode forming a ½-wavelength resonator. Also, balance patterns 103A and 103B are provided on a dielectric substrate laminated on the back surface of the dielectric substrate 105. The balance patterns 103A and 103B are electrodes forming different ¼-wavelength resonators.

The unbalance pattern 102 is an approximately U-shaped electrode including line portions 102A and 102B disposed in parallel, a line portion 102C coupling the line portions 102A and 102B, an extended electrode 102D to be coupled to a ground electrode, and an extracting electrode 102E to be coupled to an unbalance terminal. The balance patterns 103A and 103B are approximately I-shaped electrode patterns. The line portions 102A and 102B of the unbalance pattern 102 are each opposed to the balance pattern 103B or 103B with a first dielectric substrate therebetween.

When an unbalance signal is inputted into the unbalance terminal of the balun 101, the balun 101 converts the unbalance signal into a balance signal, outputs a first balance signal from one balance terminal thereof, and outputs a second balance signal having a phase almost opposite to the phase of the first balance signal from the other balance terminal thereof.

Conversely, when balance signals are inputted into the two balance terminals of the balun 101, the balun 101 converts the balance signals into unbalance signals, and outputs the unbalance signals from the unbalance terminal.

[Patent Document 1] Japanese Unexamined Patent Application Publication No. 10-290107.

In general, balance characteristics of a balance-unbalance conversion element is evaluated using the amplitude of the frequency band where the phase difference and amplitude difference between two balance signals fall within respective desired ranges.

However, in the balun 101, which is a related-art example, the shape of the unbalance pattern 102 and the disposition of the balance patterns 103A and 103B are asymmetrical. For this reason, the balun 101 has a problem that the frequency band where proper balance characteristics can be obtained is narrow.

SUMMARY OF THE INVENTION

Accordingly, an object of the present invention is to provide a balance-unbalance conversion element that is allowed to obtain proper balance characteristics over a wide frequency band.

A balance-unbalance conversion element according to the present invention includes first and second ¼-wavelength resonance lines and a ½-wavelength resonance line provided on a top surface of a dielectric substrate. The first ¼-wavelength resonance line is coupled to a first balance terminal. The second ¼ wavelength resonance line is coupled to a second balance terminal. The ½-wavelength resonance line has an open end coupled to an unbalance terminal and the first ¼-wavelength resonator and an open end coupled to the second ¼-wavelength resonator, and forms a ½-wavelength resonator. The balance-unbalance conversion element further includes a balance characteristic adjustment electrode. The balance characteristic adjustment electrode has a tip end opposed to a side of the ½-wavelength resonance line and a base end electrically coupled to a ground electrode. A center line of an electrode pattern on the top surface of the dielectric substrate, the electrode pattern including the first and second ¼-wavelength resonance lines and the ½-wavelength resonance line, and the center of the tip end of the balance characteristic adjustment electrode are separated from each other.

If the shape of an electrode pattern or the like is asymmetrical in a balance-unbalance conversion element, the distribution of an electric field in the balance-unbalance conversion element also becomes asymmetrical and thus the frequency band where proper balance characteristics can be obtained is narrowed. In such a configuration, the unbalance terminal is not coupled to a line having the second open end but only to a line having the first open end, so the distribution of the electromagnetic field becomes asymmetrical.

For this reason, by disposing the balance characteristic adjustment electrode according to the present invention, a capacitance is generated between the balance characteristic adjustment electrode and the ½-wavelength resonance line. Due to this capacitance, the position of an equivalent shorting end of the ½-wavelength resonance line is displaced. The position of the equivalent shorting end of the ½-wavelength resonance line is displaced in accordance with the position and magnitude of the capacitance provided by the balance characteristic adjustment electrode. The phase difference and amplitude difference between two balance signals in the balance-unbalance conversion element are adjusted on the basis of the position of the equivalent shorting end of the ½-wavelength resonance line. Therefore, by properly adjusting the position and the magnitude of the capacitance provided by the balance characteristic adjustment electrode, the asymmetry of the above-mentioned electromagnetic field distribution can be corrected. Thus, the balance-unbalance conversion element can obtain two balance signals, the phase difference and amplitude difference between which fall within respective given ranges over a wide frequency band.

While the balance characteristic adjustment electrode may be provided on a side surface of the dielectric substrate, it is preferable to provide the balance characteristic adjustment electrode on the main surface of the dielectric substrate. If a main surface electrode pattern including the main surface lines and balance characteristic adjustment electrode is patterned with high precision in a photolithography process or the like, it is possible to set the balance characteristics of the balance-unbalance conversion element more minutely in a case where the balance characteristic adjustment electrode is disposed on the main surface of the dielectric substrate than in a case where it is disposed on a side surface thereof.

The midpoint between both the open ends of the ½-wavelength resonance line and the center of the tip end of the balance characteristic adjustment electrode may be separated from each other. Thus, the position of the equivalent shorting end of the ½-wavelength resonance line is displaced. The phase difference and amplitude difference between two balance signals in the balance-unbalance conversion element are adjusted on the basis of the position of the equivalent shorting end of the ½-wavelength resonance line. Thus, the balance-unbalance conversion element can obtain two balance signals, the phase difference and amplitude difference between which fall within respective given ranges over a wide frequency band.

The balance-unbalance conversion element may include a shorting side surface electrode electrically coupling the base end of the balance characteristic adjustment electrode and the ground electrode and an extracting side surface electrode electrically coupling the ½-wavelength resonance line and the unbalance terminal. The shorting side surface electrode and the extracting side surface electrode may be opposed to each other between side surfaces of the dielectric substrate. Thus, it is possible to restrain the electrode pattern of the balance-unbalance conversion element from becoming asymmetrical and thus obtain two balance signals, the phase difference and amplitude difference between which fall within respective given ranges over a wide frequency band.

The center of a line width of the shorting side surface electrode may match the center line on the top surface of the dielectric substrate. Thus, it is possible to restrain the electrode pattern of the balance-unbalance conversion element from becoming asymmetrical and thus obtain two balance signals, the phase difference and amplitude difference between which fall within respective given ranges over a wide frequency band.

According to the balance-unbalance conversion element according to the present invention, it is possible to properly setting the phase difference and amplitude difference between two balance signals and thus obtain two balance signals whose phases are opposite over a wide frequency band.

REFERENCE NUMERALS

1 balance-unbalance conversion element
2A, 2B glass layer
10 dielectric substrate
11A to 11C shorting side surface electrode
12A to 12C extracting side surface electrode
13A, 13B, 14 resonance line
14A to 14C line portion
15 ground electrode
16C unbalance terminal
16A, 16B balance terminal
17 extracting electrode
19 balance characteristic adjustment electrode

DETAILED DESCRIPTION OF THE INVENTION

Figure 1:
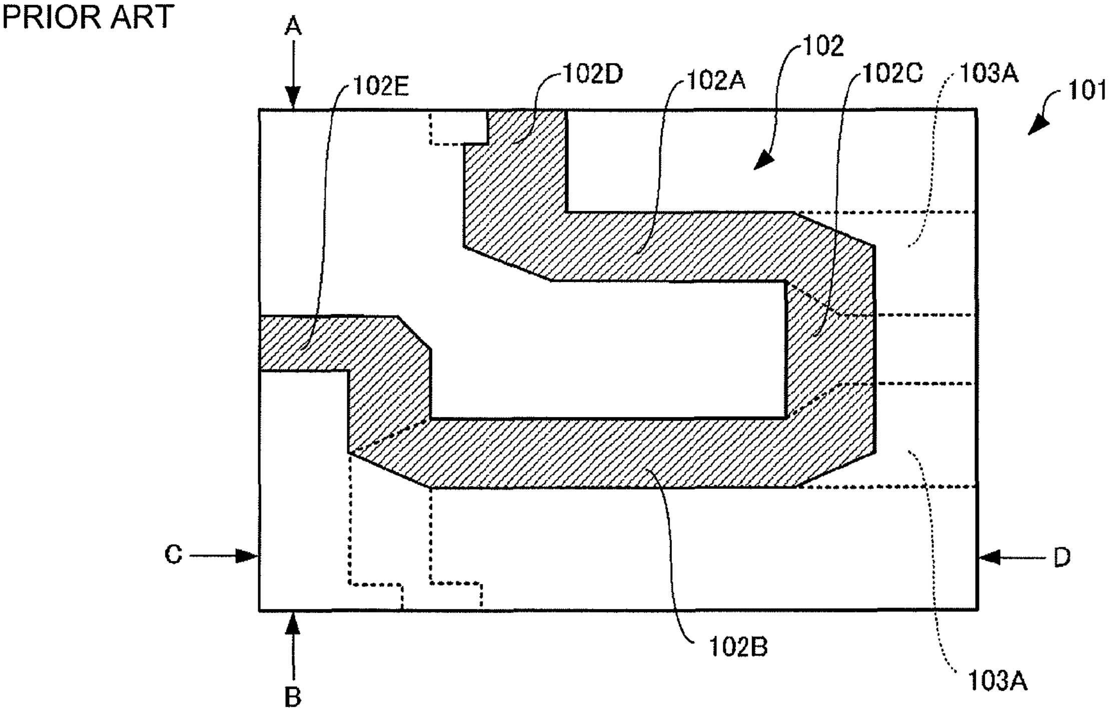
FIG. 1 PRIOR ART
FIG. 1 is a drawing showing a related-art example of a balance-unbalance conversion element.
Figure 2A:
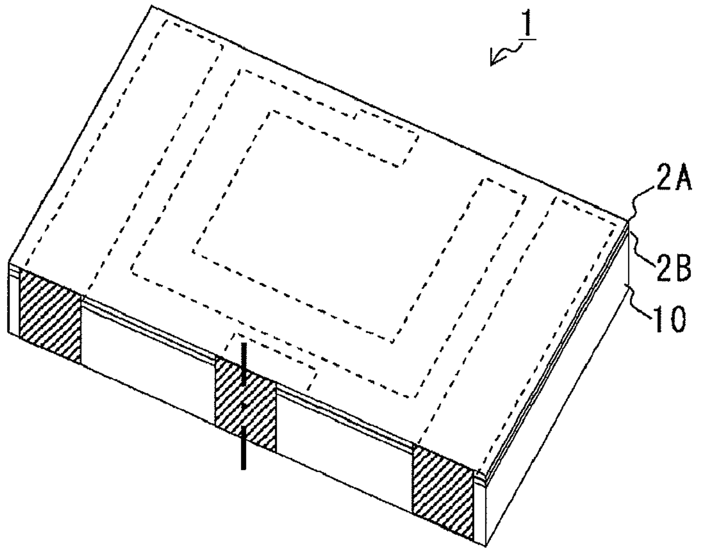
FIGS. 2(A) to 2(C) are perspective views showing a configuration example of a balance-unbalance conversion element.
Figure 2B:
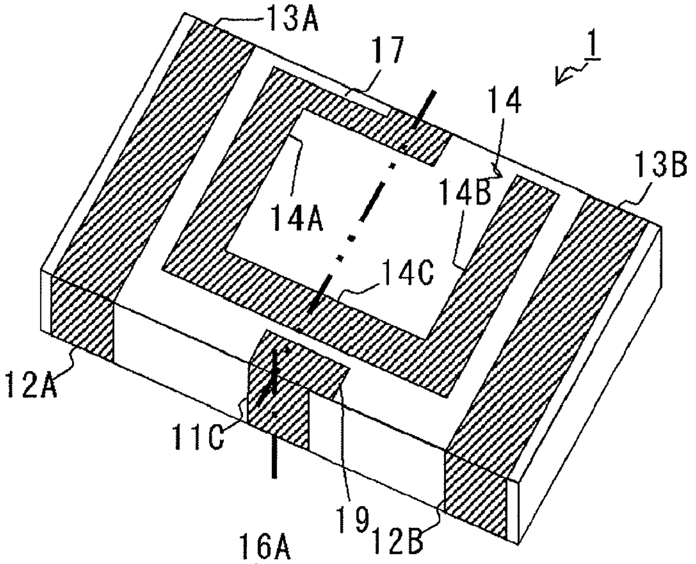
Figure 2C:
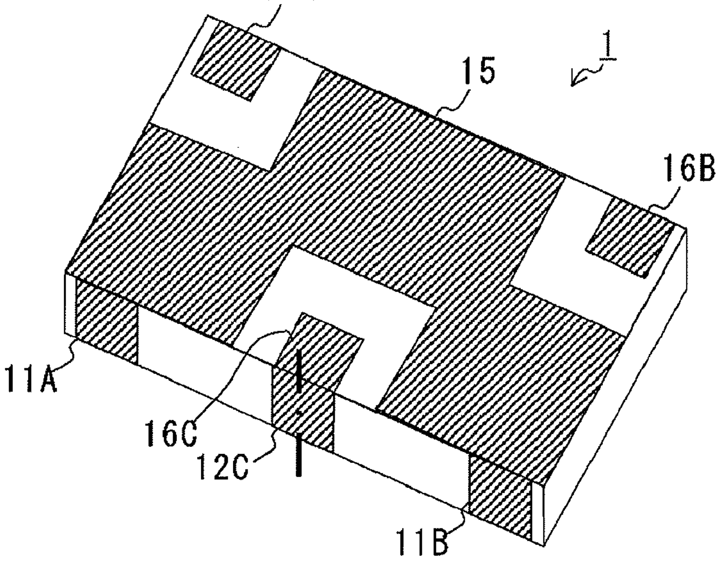

FIGS. 2(A) to 2(C) are drawings showing a configuration of a balance-unbalance conversion element. FIG. 2A is a perspective view of the top surface of the balance-unbalance conversion element. The left front side of the drawing is the front surface of the balance-unbalance conversion element and the right front side of the drawing is the right side surface thereof.

A balance-unbalance conversion element 1 is a balun element taking the shape of a small rectangular parallelepiped and to be used in UWB (ultra wide band) communications. The balance-unbalance conversion element 1 has a configuration where the top surface of a rectangular plate-shaped dielectric substrate 10 is covered with glass layers 2A and 2B. The glass layer 2B is a translucent glass layer and the glass layer 2A is a lightproof glass layer.

As for the external dimensions of the balance-unbalance conversion element 1 where the substrate thickness of the dielectric substrate 10 is 500 μm and the thicknesses of the glass layers 2A and 2B are both 15 μm, the front surface-to-bottom surface dimension is approximately 2.5 mm, the right side surface-to-left side surface dimension is approximately 2.0 mm, and the top surface-to-bottom surface dimension is approximately 0.56 mm.

The dielectric substrate 10 is a substrate made of a ceramic, dielectric material such as titanium oxide and having a relative permittivity of approximately 110. The glass layers 2A and 2B are layers formed by screen-printing and baking a glass paste made of an insulating material, such as crystal $SiO_2$ or borosilicate glass.

The translucent glass layer 2B is provided in such a manner that the glass layer 2B is in contact with the dielectric substrate 10. The translucent glass layer 2B exhibits strong adhesion to the dielectric substrate 10 so that peeling-off of a circuit pattern on the dielectric substrate 10 is prevented and so that the environment-resistant performance of the balance-unbalance conversion element 1 is enhanced.

The lightproof glass layer 2A is formed by laminating glass containing an inorganic pigment on the upper layer of the above-mentioned translucent glass layer 2B. The translucent glass layer 2A allows performing printing on a surface of the balance-unbalance conversion element 1, as well as realizes the confidentiality of the internal circuit pattern.

A structure including two glass layers does not always need to be adopted; a structure including a single glass layer may be adopted. Also, a glass layer does not always need to be provided. It is preferable to set the composition and dimensions of the dielectric substrate 10 and the glass layers 2A and 2B as appropriate in consideration of the adhesion between the dielectric substrate 10 and glass layers 2A and 2B, the environmental resistance of these elements, frequency characteristics of thereof, and the like.

Depending on the printing conditions at the time when printing side electrodes to be described later, an electrode paste may extend over the top surface of the balance-unbalance conversion element 1, that is, the top surface of the glass layer 2A. Since the glass layers 2A and 2B are laminated on the top surface of the dielectric substrate 10, portions of resonance lines that must not be connected are prevented from becoming shorted to one another even if the electrode extends over as describe above. When printing the side electrodes, the electrode may also extend over the bottom surface of the balance-unbalance conversion element 1. However, it is no problem since the electrode extending over the bottom surface is combined with a ground electrode 15, balance terminals 16A and 16B, or an unbalance terminal 16C.

FIG. 2B is a perspective view of the top surface of the dielectric substrate 10.

Resonance lines 13A and 13B, an extracting electrode 17, and a balance characteristic adjustment electrode 19 are provided on the top surface of the dielectric substrate 10. The resonance line 13B corresponds to a second ¼-wavelength resonance line according to the present invention. The resonance line 13A corresponds to a first ¼-wavelength resonance line according to the present invention. These electrodes are formed in a photolithography process, a baking process, or the like so that the electrodes are each a silver electrode with an electrode thickness of approximately 6 μm.

The resonance line 13A takes the shape of a rectangle and extends in parallel with the left side surface. The resonance line 13A is provided in a position away from the left side surface of the dielectric substrate 10 at a given interval. The resonance line 13A is connected to an extracting side surface electrode 12A on the front surface of the dielectric substrate 10 and is connected to a shorting side surface electrode 11A on the back surface thereof.

The resonance line 13B takes the shape of a rectangle and extends in parallel with the right side surface. The resonance line 13B is provided in a position away from the right side surface of the dielectric substrate 10 at a given interval. The resonance line 13B is connected to an extracting side surface electrode 12B on the front surface of the dielectric substrate 10 and is connected to a shorting side surface electrode 11B on the back surface thereof.

A resonance line 14 includes line portions 14A, 14B, and 14C. The resonance line 14 corresponds to a ½-wavelength resonance line according to the present invention. The line portion 14A is in parallel with the resonance line 13A. The line portion 14B is in parallel with the resonance line 13B. The line portion 14C extends in parallel with the front surface of the dielectric substrate 10 and links the line portions 14A and 14B. The line portion 14C is provided in a position away from the front surface at a given interval. The line portion 14B terminates at an end of the back surface. The line portion 14A is connected to the extracting electrode 17 on the back surface. Since the resonance line 14 including the line portions 14A to 14C takes a bent shape, it is possible to form a long ½-wavelength resonator with a long resonator length in a limited substrate area.

The extracting electrode 17 extends along the back surface of the dielectric substrate 10. The extracting electrode 17 is provided in a position away from the back surface at a given interval. One end of the extracting electrode 17 is connected to the resonance line 14, and the other end thereof is connected to the extracting side surface electrode 12C on the back surface of the dielectric substrate.

The balance characteristic adjustment electrode 19 is an electrode provided along the front surface of the dielectric substrate 10. One end of the balance characteristic adjustment electrode 19 is connected to a shorting side surface electrode 11C, and the other end thereof terminates in a position close to the line portion 14C.

The extracting side surface electrodes 12A and 12B and shorting side surface electrode 11C are provided on the front surface of the dielectric substrate 10. These electrodes are formed in a screen printing process, a baking process, or the like so that the electrodes are each a silver electrode with an electrode thickness of approximately 15 μm. Note that the side surface electrodes are formed not only on the front surface of the dielectric substrate 10 but also on the front surfaces of the glass layers 2A and 2B.

The extracting side surface electrode 12A is a rectangular electrode extending away from the left side surface of the dielectric substrate 10 at a given interval, and is connected to the resonance line 13A on the top surface of the dielectric substrate 10 and is connected to the balance terminal 16A on the bottom surface thereof.

The side surface electrode 12B is a rectangular electrode extending away from the right side surface of the dielectric substrate 10 at a given interval, and is connected to the resonance line 13B on the top surface of the dielectric substrate 10 and is connected to the balance terminal 16B on the bottom surface thereof.

The shorting side surface electrode 11C is a rectangular electrode extending from the bottom surface to the top surface in such a manner that the center of the line width of the shorting side surface electrode 11C matches the center (shown by a one-dot chain line in the drawing) of the front surface of the dielectric substrate 10. The shorting side surface electrode 11C is connected to the balance characteristic adjustment electrode 19 on the top surface of the dielectric substrate 10 and is connected to the ground electrode 15 on the bottom surface thereof.

FIG. 2C is a perspective view of the bottom surface of the dielectric substrate 10. The left front surface of the drawing is the back surface of the balance-unbalance conversion element 1 and the right front surface of the drawing is the right side surface thereof.

The ground electrode 15, balance terminals 16A and 16B, and unbalance terminal 16C are provided on the bottom surface of the dielectric substrate 10. These electrodes are formed in a screen printing process, a baking process, or the like so that the electrodes are each a silver electrode with an electrode thickness of approximately 15 μm.

The balance terminal 16A is a rectangular electrode provided on the front surface and left side surface of the dielectric substrate 10. When mounting the balance-unbalance conversion element 1 on a mount substrate, the balance terminal 16 is connected to one of balance signal input/output terminals. The balance terminal 16 is connected to the extracting side surface electrode 12A on the front surface of the dielectric substrate 10.

The balance terminal 16B is a rectangular electrode provided on the front surface and right side surface of the dielectric substrate 10. When mounting the balance-unbalance conversion element 1 on the mount substrate, the balance terminal 16B is connected to the other of the balance signal input/output terminals. The balance terminal 16B is connected to the extracting side surface electrode 12B on the front surface of the dielectric substrate 10.

The unbalance terminal 16C is a rectangular electrode provided on the center of the bottom surface of the dielectric substrate 10. When mounting the balance-unbalance conversion element 1 on the mount substrate, the unbalance terminal 16C is connected to an unbalance signal input/output terminal. The unbalance terminal 16C is connected to the extracting side surface electrode 12C on the back surface of the dielectric substrate 10.

The ground electrode 15 is a ground electrode of a strip line resonator provided on almost the entire bottom surface of the dielectric substrate 10 except for the vicinities of the balance terminals 16A and 16B and unbalance terminal 16C. The ground electrode 15 also serves as an electrode for mounting the balance-unbalance conversion element 1 on the mount substrate. The ground electrode 15 is connected to the shorting side surface electrode 11C in the center of the front surface of the dielectric substrate 10, is connected to the shorting side surface electrode 11A on the back surface and left side surface of the dielectric substrate 10, and is connected to the shorting side surface electrode 11B on the back surface and right side surface of the dielectric substrate 10. The resonance line 14 is opposed to the ground electrode 15, while the extracting electrode 17 is not opposed thereto. Therefore, ends close to the back surface, of the line portions 14A and 14*b* of the resonance line 14 serve as open ends of the resonance line 14.

Also, the extracting side surface electrode 12C and shorting side surface electrodes 11A and 11B are provided on the back surface of the dielectric substrate 10. These electrodes are formed in a screen printing process, a baking process, or the like so that the electrodes are each a silver electrode with an electrode thickness of approximately 15 μm. Note that the side surface electrodes are formed not only on the back surface of the dielectric substrate 10 but also on the back surfaces of the glass layers 2A and 2B.

The shorting side surface electrode 11A is a rectangular electrode extending away from the left side surface of the dielectric substrate 10 at a given interval. The shorting side surface electrode 11A is connected to the resonance line 13A on the top surface of the dielectric substrate 10 and is connected to the ground electrode 15 on the bottom surface thereof.

The shorting side surface electrode 11B is a rectangular electrode extending away from the right side surface of the dielectric substrate 10 at a given interval. The shorting side surface electrode 11B is connected to the resonance line 13B on the top surface of the dielectric substrate 10 and is connected to the ground electrode 1 on the bottom surface thereof.

The shorting side surface electrode 12C is a rectangular electrode extending from the bottom surface to the top surface in such a manner that the center of the line width of the shorting side surface electrode 12C matches the center (shown by a one-dot chain line in the drawing) of the back surface of the dielectric substrate 10. The shorting side surface electrode 12C is connected to the extracting electrode 17 on the top surface of the dielectric substrate 10 and is connected to the unbalance terminal 16C on the bottom surface thereof.

The shorting side surface electrodes 11A to 11C and extracting side surface electrodes 12A to 12C have equal line widths. Also, the resonance lines 13A and 13B have equal line widths. It is preferable to adjust these line widths in order to realize frequency characteristics of the resonators required by the balance-unbalance conversion element.

By forming the balance-unbalance conversion element 1 as described above, the resonance lines 13A and 13B each form a ¼-wavelength resonator having one open end and one shorting end, together with the ground electrode 15. The resonance line 14 forms a ½-wavelength resonator having opened both ends together with the ground electrode 15. The ¼-wavelength resonator formed by the resonance line 13A and the ½-wavelength resonator formed by the resonance line 14 are interdigitally coupled. The ¼-wavelength resonator formed by the resonance line 13B and the ½-wavelength resonator formed by the resonance line 14 are interdigitally coupled. The ¼-wavelength resonator formed by the resonance line 13A is tap-coupled to the balance terminal 16A. The ¼-wavelength resonator formed by the resonance line 13B is tap-coupled to the balance terminal 16B. The ½-wavelength resonator formed by the resonance line 14 is tap-coupled to the unbalance terminal 16C.

Thus, the balance-unbalance conversion element 1 converts balance signals inputted into the balance terminals 16A and 16B into unbalance signals and outputs the unbalance signals from the unbalance terminal 16C. Or, the balance-unbalance conversion element 1 converts unbalance signals inputted into the unbalance terminal 16C into balance signals and outputs the balance signals from the balance terminal 16A and 16B. In this balance-unbalance conversion element, the resonance lines are strongly coupled to each other by means of interdigital coupling so that the frequency band is widened.

Also, the electrode thicknesses of the resonance lines 13A and 13B are both set to approximately 6 μm, while the electrode thicknesses of the side surface electrodes are all set to approximately 15 μm. As a result, currents at shorting ends of the resonance lines 13A and 13B where current concentration typically occurs are dispersed so that the conductor loss is reduced. This configuration makes the balance-unbalance conversion element 1 an element having a small insertion loss.

Also, the side surface electrodes are jointly formed on the front surface and bottom surface of the dielectric substrate 10. This eliminates the need to distinguish the front surface of the dielectric substrate 10 from the bottom surface thereof when printing the side surface electrodes. Thus, even if the orientations of the dielectric substrates are not completely aligned, the side surface electrodes can be printed. Therefore, the printing process can be simplified.

Also, the resonance lines 13A and 13B and 14 are formed in such a manner that these resonance lines are approximately line-symmetrical on the top surface of the dielectric substrate 10. This restrains the electrode patterns of the balance-unbalance conversion element from becoming asymmetrical, thereby making the balance characteristics proper ones over a wider band.

Incidentally, in the balance-unbalance conversion element 1, the balance characteristic adjustment electrode 19 is provided near the front surface on the top surface of the dielectric substrate 10, so a capacitance occurs between the vicinity of an end of the balance characteristic adjustment electrode 19 and the line portion 14C of the resonance line 14. Due to the capacitance provided by the balance characteristic adjustment electrode 19, the position of an equivalent shorting terminal of the ½-wavelength resonator formed by the resonance line 14 is displaced from the position thereof in a case where the balance characteristic adjustment electrode 19 is not provided. Therefore, the position of the equivalent shorting terminal of the ½-wavelength resonator can be adjusted on the basis of the position and magnitude of the provided capacitance. This makes it possible to adjust the balance characteristics of balance signals of the balance terminals 16A and 16B and thus confine the phase difference and amplitude difference between two balance signals within respective desired ranges over a wide frequency band.

Since the balance characteristic adjustment electrode 19 must be provided in an area on the top surface of the dielectric substrate 10 except for the areas where the resonance lines 13A and 13B and 14 are formed, the shape and size of the electrode 19 are limited. If the areas where the resonance lines 13A and 13B and 14 are formed occupy a large proportion of the top surface of the dielectric substrate 10, the shape and size of the balance characteristic adjustment electrode 19 are extremely limited. For this reason, there is a possibility that a required capacitance value cannot be obtained. In this case, there is a possibility that the balance characteristics cannot be adjusted into desired ones.

However, if the position where the balance characteristic adjustment electrode 19 is disposed is displaced from the center of the top surface of the dielectric substrate shown by a two-dot chain line in the drawing toward the right side surface of the dielectric substrate 10 as in the balance-unbalance conversion element 1, the position where the above-mentioned capacitance is provided is changed. Thus, even if the above-mentioned capacitance is small, it is possible to expand the adjustment range of the balance characteristics.

Also, since the balance characteristic adjustment electrode is provided on the main surface of the dielectric substrate, it is possible to pattern the balance characteristic adjustment electrode with high precision and thus set the balance characteristics of the balance-unbalance conversion element minutely by patterning the main surface electrode pattern including the main surface lines and balance characteristic adjustment electrode with high precision in a photolithography process or the like.

While the shorting side surface electrode 11C is disposed such a manner that the center of the line width thereof matches the center (shown by a one-dot chain line in the drawing) of the front surface of the dielectric substrate 10, the centers do not always need to be matched.

Also, in this configuration, the balance characteristic adjustment electrode 19 is provided on the top surface of the dielectric substrate 10; however, the electrode 19 does not always need to be provided on the top surface and the shorting side surface electrode 11C may be used as a balance characteristic adjustment electrode. In this case, it is possible to adjust the balance characteristics of the balance-unbalance conversion element 1 by displacing the shorting side surface electrode 11C from the center (shown by a one-dot chain line in the drawing) of the front surface of the dielectric substrate 10 as in a case where the balance characteristic adjustment electrode 19 is provided.

Figure 3A:
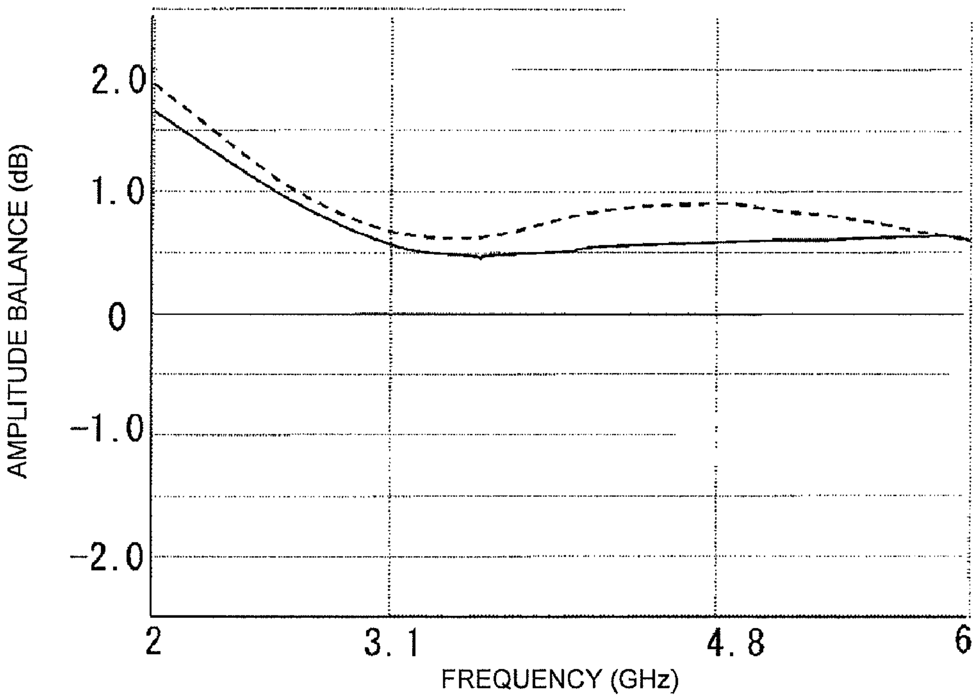
FIGS. 3(A) and 3(B) are graphs showing the result of a simulation performed with respect to the balance-unbalance conversion element.

A graph shown in FIG. 3A represents a result obtained by simulating the amplitude difference (amplitude balance) between two balance signals in accordance with the presence or absence of the balance characteristic adjustment electrode 19 in the balance-unbalance conversion element 1. That is, the graph shows to what extent the amplitudes of two balance signals vary. In FIG. 3A, the lateral axis represents the frequency and the longitudinal axis represents the amplitude difference between two balance signals. A solid line in the drawing is a graph representing a case where the balance characteristic adjustment electrode 19 shown in this configuration is provided. A broken line is a graph representing a comparative configuration that is similar to the present configuration but is a configuration where the center of the line width of the balance characteristic adjustment electrode 19 matches the center (shown by the two-dot chain line in the drawing) of the top surface of the dielectric substrate 10.

According to the simulation result, the amplitude difference between two balance signals in the present configuration is smaller and flatter than that in the comparative configuration over a desired frequency band (in this example, 3.1 to 4.8 GHz). As seen, in the configuration according to this embodiment, a flatter amplitude characteristic is obtained by properly setting the above-mentioned capacitance.

As seen, it is possible to make flatter the amplitude difference between two balance signals in the balance-unbalance conversion element 1 by displacing the disposition of the balance characteristic adjustment electrode 19. Thus, it is possible to obtain two balance signals, the amplitude difference between which falls within a given range over a wide frequency band.

Figure 3B:
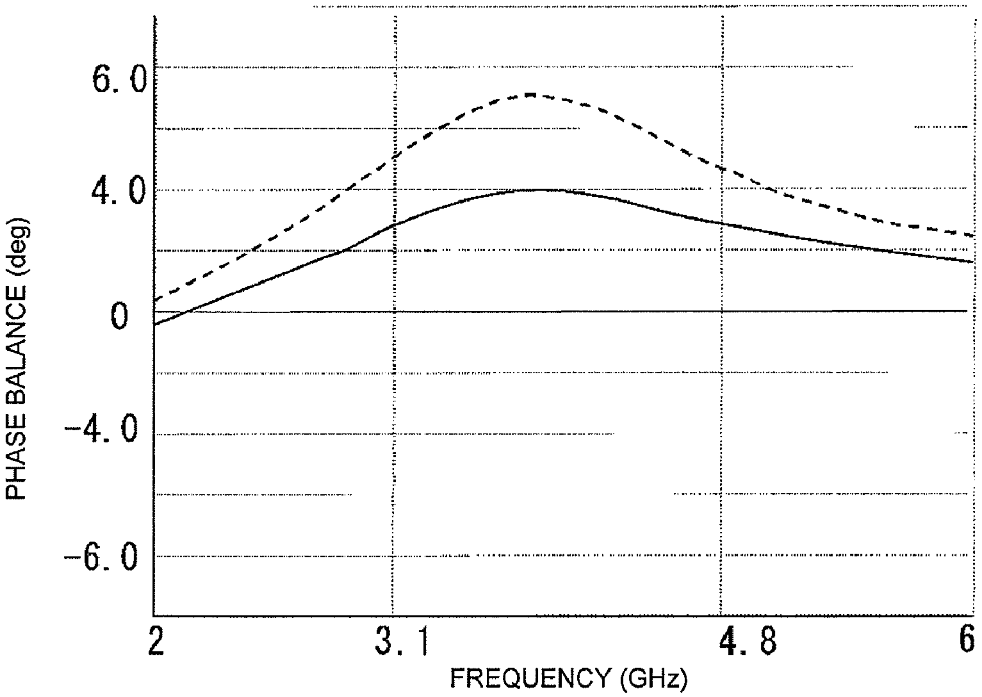

A graph shown in FIG. 3B represents a result obtained by simulating the phase difference (phase balance) between two balance signals in accordance with the presence or absence of the balance characteristic adjustment electrode 19. That is, the graph shows to what extent the phases of two balance signals vary. In FIG. 3B, the lateral axis represents the frequency and the longitudinal axis represents the phase difference between two balance signals. A solid line in the drawing is a graph representing a case where the balance characteristic adjustment electrode 19 according to the present configuration is provided. A broken line in the drawing is a graph representing a comparative configuration that is similar to the present configuration but is a configuration where the position (the center of the line width) of the balance characteristic adjustment electrode 19 matches the center of the dielectric substrate 10.

According to the simulation result, the phase difference between two balance signals in the configuration according to this embodiment shown by the solid line in the graph is smaller and flatter than that according to the comparative configuration shown by the dotted line in the graph over a predetermined frequency (in this example, 3.1 to 4.8 GHz). As seen, in the configuration according to this embodiment, a flatter phase difference characteristic can be obtained.

As seen, it is possible to make flatter the phase difference between two balance signals in the balance-unbalance conversion element 1 by displacing the disposition position of the balance characteristic adjustment electrode 19. Thus, it is possible to obtain two balance signals, the phase difference between which falls within a given range over a wide frequency band.

The resonance lines and shorting side surface electrodes in the above-mentioned configuration example are disposed and configured in accordance with the product specification and may take any shapes according to the product specification. The present invention is applicable to configurations other than the above-mentioned configuration and can be used as the pattern shapes of various balance-unbalance conversion elements. Also, another configuration (high-frequency circuit) may be provided to this balance-unbalance conversion element.

The invention claimed is:

1. A balance-unbalance conversion element including:

a dielectric substrate;

an electrode pattern on a surface of the dielectric substrate, the electrode pattern including:

a first ¼-wavelength resonance line coupled to a first balance terminal, the first ¼-wavelength resonance line forming a first ¼-wavelength resonator;

a second ¼-wavelength resonance line coupled to a second balance terminal, the second ¼-wavelength resonance line forming a second ¼-wavelength resonator; and a ½-wavelength resonance line having a first open end coupled to an unbalance terminal and the first ¼-wavelength resonator and a second open end coupled to the second ¼-wavelength resonator; and a balance characteristic adjustment electrode having a tip end opposed to a side of the ½-wavelength resonance line and a base end electrically coupled to a ground electrode, wherein a center line of the electrode pattern on the surface of the dielectric substrate and the center of the tip end of the balance characteristic adjustment electrode are separated from each other.

2. The balance-unbalance conversion element according to claim 1, wherein the balance characteristic adjustment electrode is disposed on the surface of the dielectric substrate.

3. The balance-unbalance conversion element according to claim 1, wherein a midpoint between the first and second open ends of the ½-wavelength resonance line and the center of the tip end of the balance characteristic adjustment electrode are separated from each other.

4. The balance-unbalance conversion element according to claim 1, further comprising:

a shorting side surface electrode electrically coupling the base end of the balance characteristic adjustment electrode and the ground electrode; and an extracting side surface electrode electrically coupling the ½-wavelength resonance line and the unbalance terminal, wherein the shorting side surface electrode and the extracting side surface electrode are opposed to each other with the dielectric substrate therebetween.

5. The balance-unbalance conversion element according to claim 4, wherein a center of a line width of the shorting side surface electrode matches the center line of the electrode pattern on the surface of the dielectric substrate.

6. The balance-unbalance conversion element according to claim 1, further comprising at least one glass layer covering the electrode pattern on the surface of the dielectric substrate.

7. The balance-unbalance conversion element according to claim 6, wherein a first and a second glass layer cover the electrode pattern.

8. The balance-unbalance conversion element according to claim 7, wherein the first glass layer is a translucent layer and the second glass layer is a lightproof layer.

9. The balance-unbalance conversion element according to claim 8, wherein the first glass layer is in contact with the surface of the dielectric substrate.

10. The balance-unbalance conversion element according to claim 1, wherein the ground electrode is provided on a second surface of the dielectric substrate opposite to the electrode pattern.

11. The balance-unbalance conversion element according to claim 1, wherein the first ¼-wavelength resonance line, the second ¼-wavelength resonance line, and the ½-wavelength resonance line are substantially line-symmetrical.

* * * * *